United States Patent [19]

Ling et al.

[11] Patent Number: 4,700,086
[45] Date of Patent: Oct. 13, 1987

[54] CONSISTENT PRECHARGE CIRCUIT FOR CASCODE VOLTAGE SWITCH LOGIC

[75] Inventors: Daniel T. Ling, Croton-on-Hudson; Vojin G. Oklobdzija, Carmel; Norman Raver, Yorktown Heights, all of N.Y.

[73] Assignee: International Business Machines Corporation, Armonk, N.Y.

[21] Appl. No.: 726,211

[22] Filed: Apr. 23, 1985

[51] Int. Cl.⁴ .................. H03K 19/003; H03K 19/096
[52] U.S. Cl. .................... 307/443; 307/452; 307/453; 307/481; 307/279
[58] Field of Search ............... 307/443, 448, 451–453, 307/481, 279, 577, 579, 583

[56] References Cited

U.S. PATENT DOCUMENTS

| | | | |
|---|---|---|---|
| 3,461,312 | 8/1969 | Farber et al. | 377/79 |
| 3,518,451 | 6/1970 | Booher | 307/443 |
| 3,943,377 | 3/1976 | Suzuki | 307/443 X |
| 3,984,703 | 10/1976 | Jorgensen | 307/443 X |
| 3,989,955 | 11/1976 | Suzuki | 307/279 X |
| 4,040,015 | 8/1977 | Fukuda | 307/452 X |
| 4,345,170 | 8/1982 | Sampson, III | 307/443 |
| 4,570,084 | 2/1986 | Griffin et al. | 307/452 |

FOREIGN PATENT DOCUMENTS 0082773  6/1983  European Pat. Off. ............ 307/452

OTHER PUBLICATIONS

Bilger et al, "Single-Ended Unclocked CMOS Logic"; IBM-TDB; vol. 27, No. 10B, pp. 6012-6013; 3/1985.

Primary Examiner—Stanley D. Miller
Assistant Examiner—D. R. Hudspeth
Attorney, Agent, or Firm—Sughrue, Mion, Zinn, Macpeak and Seas

[57] ABSTRACT

A precharge circuit for a cascode voltage switch in which at the beginning of the precharge phase the output state is memorized and the output is isolated from the precharging points. Both the positive and negative ends of the discharge paths are precharged with the gates of the switches in all paths held in their memorized states. Towards the end of precharging, the output is reconnected to the normal precharging point so that it goes low. Then the positive and negative precharging points are reconnected for their evaluation configuration.

7 Claims, 10 Drawing Figures

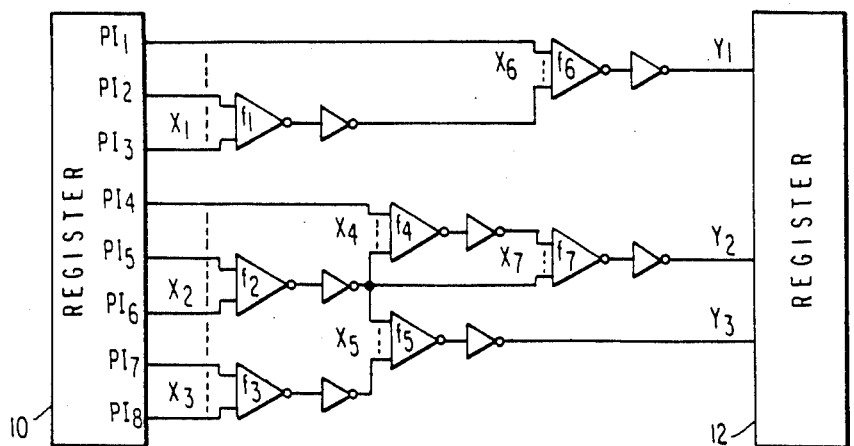
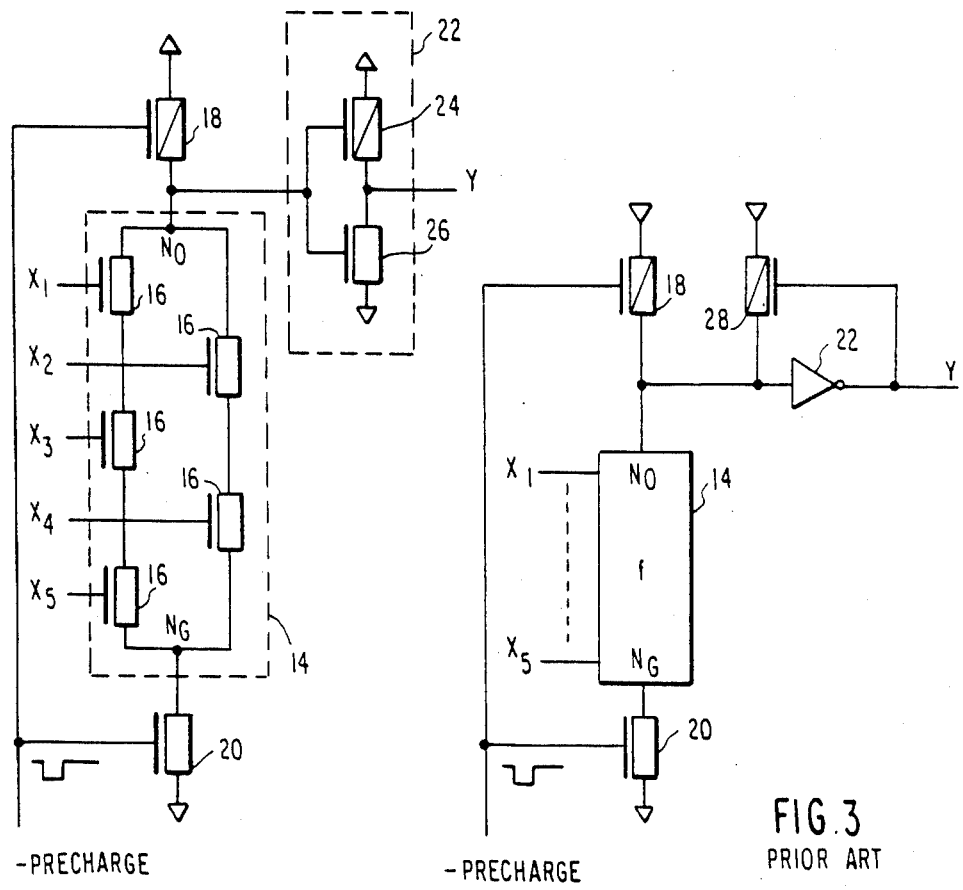
FIG. 1 PRIOR ART
FIG. 2 PRIOR ART
FIG. 3 PRIOR ART

CONSISTENT PRECHARGE CIRCUIT FOR CASCODE VOLTAGE SWITCH LOGIC

DESCRIPTION

1. Technical Field

The invention relates generally to logic circuits. In particular, the invention relates to a method for consistently precharging the nodes of a dynamic logic circuit.

2. Background

A recently developed technology for logic circuits is called alternatively a cascode voltage switch (CVS) or CMOS domino circuit. An early description of this type of circuit appears in a technical article by Krambeck et al., entitled "High-Speed Compact Circuits With CMOS" and appearing in IEEE Journal of Solid-State Circuits, volume SC-17, No. 3, June 19, 1982 at pp. 614–619. A similar circuit is disclosed by Booher in U.S. Pat. No. 3,601,627. The overall structure of a generalized but exemplary CVS circuit is shown in FIG. 1. An input register 10 provides a plurality of primary inputs $PI_1$–$PI_8$, of which only eight are explicitly shown. There are generally a plurality of logic modules consisting of a group of logic transistors $F_i$ having one or more inputs $X_i$ and followed by an inverter. The inputs $X_i$ of the logic group $F_i$ are either the primary inputs $PI_1$–$PI_8$ or the output of the inverter of a logic group $F_j$ of a previous stage. Selected outputs $Y_1$–$Y_3$, three are shown in the example, are led to an output register 12. The complemented output of the logic group $F_i$ and the following inverter follow from the usual implementations of the logic group $F_i$.

A relatively simple logic group 14 is shown in FIG. 2 and is implemented with five n-channel gates 16 each having a gate input $X_i$. The function implemented is —OR(AND($X_1$, $X_3$, $X_5$), AND($X_2$, $X_4$)). This logic group 14 is presented for sake of example and much more complicated logic groups are possible. The signal node $N_0$ of the logic group 14 is separated from the power supply by a p-channel upper precharge gate 18. The grounding node $N_G$ of the logic group 14 is separated from ground by an n-channel lower precharge gate 20. In a precharge period, the inputs $X_1$ are low so that all the logic gates 16 are non-conducting. When a precharge signal -PRECHARGE goes low, it isolates the grounding node $N_G$ from ground but opens the signal node $N_0$ to the power supply voltage. As a result, the signal node $N_0$ is charged in the precharge period. The signal node $N_0$ is connected to a CMOS inverter 22 having a p-channel gate 24 and an n-channel gate 26 serially connected between the power supply and ground with the output Y connected between the gates 24 and 26. The CMOS inverter 22 causes its output Y to be the inverse of the signal on the signal node $N_0$. It should be noted that at the end of the precharge period, the signal on the signal node $N_0$ is high so that the output signal Y is low at the end of precharging. Since the output signal Y may be an input signal $X_i$ of another logic group 14, the necessity of low signals on the inputs $X_1$–$X_5$ during precharging is satisfied when one or more of these inputs $X_1$–$X_5$ is the output Y of another logic group 14. The primary inputs $PI_1$ are required to follow this same convention by an appropriate interface circuit.

Following the precharge period, the grounding node $N_G$ is reconnected to ground by -PRECHARGE returning high but the signal node $N_0$ is isolated from the power supply and left floating with the precharge. The primary inputs $PI_1$–$PI_8$ then assume their signal values and some of the logic gates are opened depending upon the signals $X_1$–$X_5$. If a discharge path from the signal node $N_0$ to the grounding node $N_G$ is formed by the input signals $X_1$–$X_5$, then the precharged grounding node $N_0$ is discharged to a low state. This new low state then switches the CMOS inverter 22 and the output signal Y goes high. If, on the other hand, no discharge path is created, then the output signal Y remains low.

The output signal Y may be used as an input to a logic group at a further stage and may thus cause that precharged logic group to discharge. Hence, the name domino.

As described, a CVS circuit is dynamic in that it requires the precharging of the signal node $N_0$ and the subsequent evaluation of the signal on that signal node $N_0$, whether continuing to be precharged or having been subsequently discharged. As with most dynamic circuits, there is a problem with the leakage and fluctuation of the precharge from the signal node $N_0$. Leakage in a dynamic circuit is a pervasive problem and solutions are disclosed by Kinoshita in U.S. Pat. No. 4,433,257. One method to reduce the leakage problem is illustrated in FIG. 3 in which a p-channel feedback gate 28 is connected between the input to the inverter 22 and the power supply. A similar feedback technique is disclosed by Suzuki in U.S. Pat. Nos. 3,989,955 and 4,464,587 and by Taylor in U.S. Pat. No. 4,398,270. The gate of the feedback gate 28 is controlled by the output Y of the inverter 22. When the signal node $N_0$ is charged or high, the output signal Y is low thus closing the feedback gate 28 and solidly connecting the signal node $N_0$ to the power supply voltage. As a result, any leakage from the signal node $N_0$ is compensated. However, the feedback gate 28 is a weak gate such that when the signal node $N_0$ is positively discharged, the feedback gate 28 cannot feed sufficient charge to the inverter 28 to prevent its output signal Y from turning off the feedback gate 28.

A yet more elaborate feedback is illustrated in FIG. 4, in which additionally a n-channel feedback channel 30 is connected between the input to the inverter 22 and ground. The n-channel gate 30 is also controlled by the output Y of the inverter 22. When the signal on the signal node $N_0$ is discharged or low, the output Y of the inverter 22 closes the n-channel feedback channel 30 to connect the input of the inverter 22 to a solid ground. Thus fluctuations and charge leaking onto the signal node $N_0$ are compensated. Similarly to the p-channel feedback gate 28, the n-channel feedback gate 30 is a week gate that can be overcome by a positive charging of the signal node $N_0$. Together, the feedback gates 28 and 30 comprise a weak feedback inverter 32, as illustrated in FIG. 5. The two inverters 22 and 32 thus act as a regenerative memory for any strong signal impressed upon the signal node $N_0$.

CVS circuits have many advantages but the technology appears to be plagued with spurious signals or glitches. The signal on the signal node $N_0$ is subject to fluctuations, particularly at the beginning of the evaluation phase. The feedback, illustrated in FIGS. 3 and 4, is intended to reduce these fluctuations. However, in a dynamic circuit, the feedback must be weak. Thus the situation may arise that the output signal Y varies momentarily to an incorrect high value. Even if the feedback subsequently brings the output signal Y to the correct low value, the transient incorrect value may have already discharged the logic group 14 of a subsequent stage. Thus, feedback alone does not seem to solve the problem and the source of the fluctuations need to be sought.

SUMMARY OF THE INVENTION

Accordingly, an object of this invention is to provide a cascode voltage switching circuit that has reduced susceptibility to internal noise.

A further object of this invention is to reduce the fluctuations without an undue increase in the complexity of the circuit.

The invention can be summarized as a method of precharging a cascode voltage switch circuit in which the output signal of the previous cycle continues to be impressed upon the output during the precharge phase. At the beginning of precharging, a pass gate between the logic gate and the output inverter is opened, thus isolating the output from the precharging voltage. Both the signal node and the grounding node are precharged. The continued application of the previous output signals to the logic groups during the precharging causes all internal nodes which had been discharged in the previous cycle to be precharged in the current precharging period.

BRIEF DESCRIPTION OF THE DRAWINGS

FIG. 1 is simplified schematic of an exemplary cascode voltage switch circuit.

FIG. 2 is a schematic illustration of a module in a CVS circuit.

FIG. 3 and 4 are improvements of the circuit of FIG. 2, utilizing feedback.

DETAILED DESCRIPTION OF THE PREFERRED EMBODIMENTS

Figure 6:
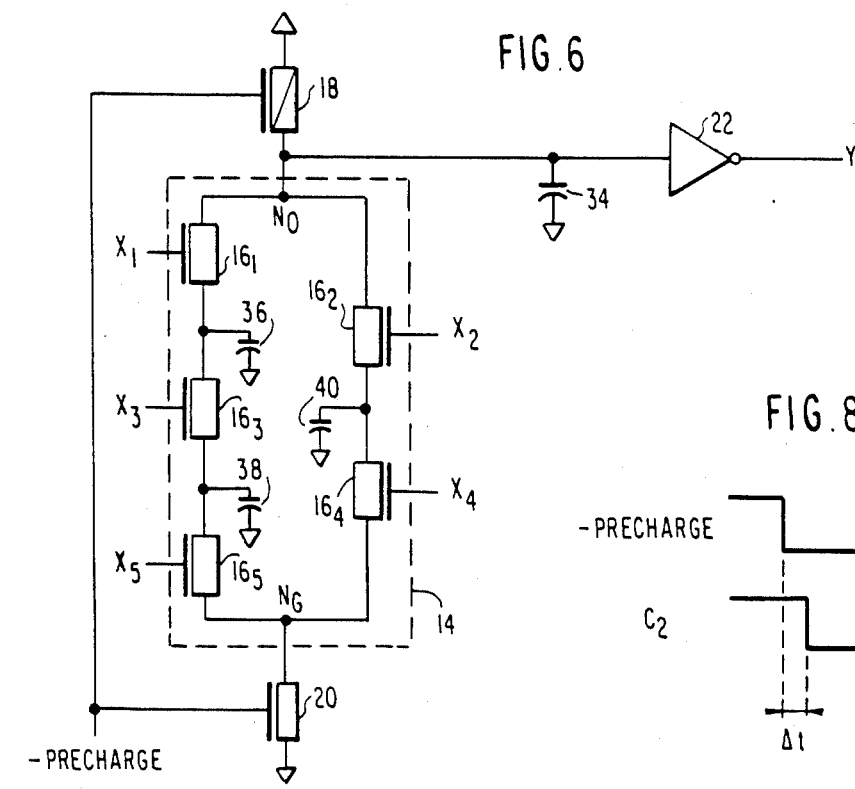
FIG. 6 is a schematic illustration of the precharging points of the circuit of FIG. 2.

The inventors believe that a major cause of the signal fluctuations in cascode voltage switch (CVS) circuits arises from redistribution of the precharge dependent upon the signal inputs of the prior evaluation phase. This effect will be explained with reference to FIG. 6, which illustrates some details omitted from FIG. 2. The precharging of the signal node $N_0$ implies that there is a substantial capacitance 34 associated with that node. In MOS technology, there is often enough parasitic capacitance associated with the long interconnections between the signal node $N_0$, the upper precharge gate 18 and the inverter 22 so that the capacitance 34 does not need to be separately provided. In the precharging phase, the capacitance 34 is positively charged and is discharged in the evaluation phase if a conducting path is formed through the logic group 14 to ground.

However, the capacitance 34 is not the only parasitic capacitance in the circuit. There is additional capacitance 36, 38 and 40 at the points between the logic gates 16. However, according to the design convention for CVS circuits, all the inputs $X_1$-$X_5$ are low during the major portion of the precharging period so that the associated gates $16_1$-$16_5$ are open or nonconducting during precharging. As a result, the parasitic capacitances 36-40 within the logic group 14 are not precharged. For the most part, the amount of charge on the capacitances 36-40 at the end of the precharging period is determined by the amount to which they were charged at the end of the prior evaluation period. This amount of charge, in turn, is determined by the values of the input signals $X_1$-$X_5$ in the prior evaluation period. For example, assuming that the internal capacitance 36-40 were fully charged before the prior evaluation period, if all the input signals $X_1$-$X_5$ were 0 in the prior evaluation period, then the internal capacitance 36-38 remain fully charged for the current evaluation period. If, on the other hand, all the input signals $X_1$-$X_5$ in the prior evaluation period were 1, then the prior evaluation period caused all the internal capacitances 36-40 to discharge. Furthermore, different combinations of input signals $X_1$-$X_5$ in the prior evaluation phase can cause different combinations of the internal capacitances 36-40 to be discharged. The importance of precharging inherent capacitance has been discussed by Kitagawa in U.S. Pat. No. 3,778,782 and by Moench in U.S. Pat. No. 4,200,917.

In the subsequent evaluation phase following precharging, the precharge on the signal node $N_0$, actually the precharge on the capacitance 34, may be discharged to ground if the input signals $X_1$-$X_5$ form a conducting path to ground. In this case, the signal on the signal node $N_0$ is discharged to 0 although the transition time may depend upon the amount of charge on the internal capacitances 36-40. If the input signals $X_1$ and $X_2$ are 0 during the evaluation phase, then all the precharge remains on the signal node $N_0$ and a solid high signal is presented to the inverter 22. The real problem arises when the combination of inputs $X_1$-$X_5$ are intended to not form a conducting path, that is, the signal node $N_0$ is intended to remain charged or a 1, but some of the upper logic gates, such as gates $16_1$ or $16_2$ are nontheless closed or made conducting. As a result, the capacitance 36 or 40 or possibly both are put in parallel to the capacitance 34. If the capacitance 36 or 40 remains charged from the previous evaluation phase, then the problem should be relatively small because all the capacitances have been charged by similar voltages. However, if the internal capacitance 36 or 40 has been discharged in the prior evaluation phase, then the precharge on the capacitance 34 is redistributed to the discharged capacitance 36 or 40 or possibly both. This redistribution of the precharge causes the voltage on the signal node $N_0$ to dip. The dip is thus dependent upon the input signals $X_1$-$X_5$ of the prior evaluation phase as well as the input signals $X_1$-$X_5$ of the current evaluation phase, and thus is difficult to predict or control.

Figure 4:
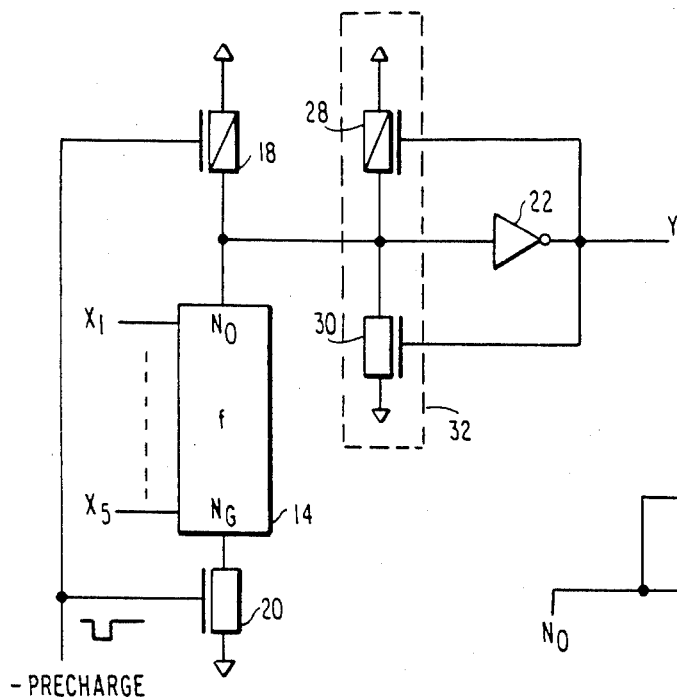
Figure 5:
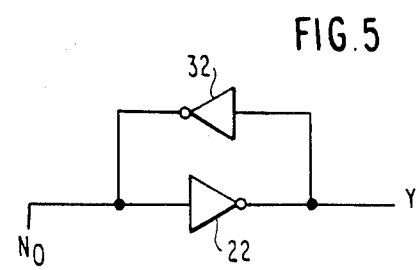
FIG. 5 is a schematic diagram illustrating the feedback memory of FIG. 4.

The feedback around the inverter 22, as shown in either FIGS. 3 or 4, can compensate for this dip and bring the signal on the signal node $N_0$ back up to a solid high as long as the dip is not too severe. However, as previously mentioned, the feedback must be weak so that a transient dip appears inevitable in view of the dynamic nature of a CVS circuit. It is possible that the feedback eventually brings the high signal on the signal node $N_0$ back to its correct value, but, in the meantime, the output signal Y may have changed enough to have caused a logic group 14 of the following stage to have discharged. Once this following logic group has been discharged, the application of the correct input signals to that stage, intended to keep that logic group charged, cannot recharge the signal node $N_0$ of the following group. As a result, transient signal errors become permanent by the domino nature of a CVS circuit.

Figure 7:
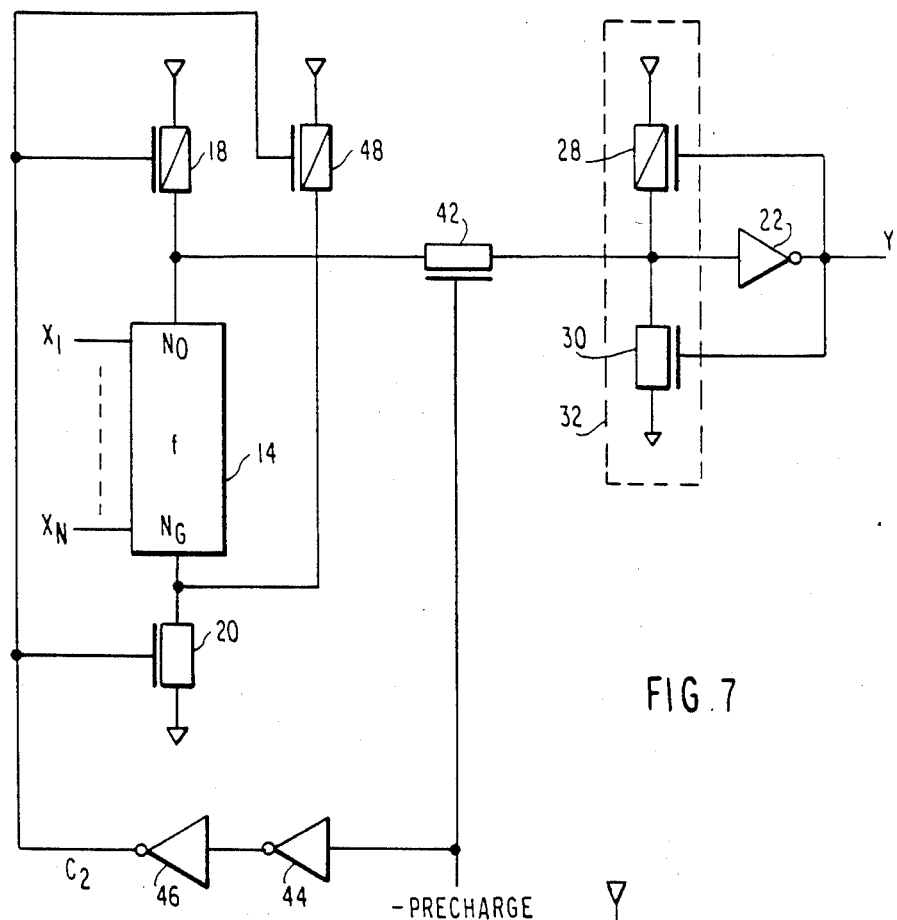
FIG. 7 is a schematic illustration of one embodiment of the present invention.

The invention uses this understanding of the problem to reduce fluctuations by the following method. The output signal Y is memorized and then held during the precharging period at the level it had in the prior evaluation phase. That is, before the precharging period both the signal node $N_0$ and the ground node $N_G$ are both precharged. Gingerich in U.S. Pat. No. 4,435,791 discloses precharging both sides of a CMOS latch. The implementation for the CVS module of FIG. 4 is shown in FIG. 7. A -PRECHARGE signal, having a slightly different function than the -PRECHARGE of FIGS. 2 and 6, directly controls the gate of an n-channel pass transistor 42 connecting the signal node $N_0$ to the input to the inverter 22. Thus, at the beginning of the precharge period, the signal node $N_0$ is isolated from the inverter 22 and the weak feedback inverter 32. As previously mentioned, the combination of the inverters 22 and 32 act as a memory device. With the memory device thus isolated from the precharging, the output signal Y of the prior evaluation phase is held during the current precharging period. Booher in the previously cited patent uses an isolation transistor to pass a logic signal to an output.

Figure 8:
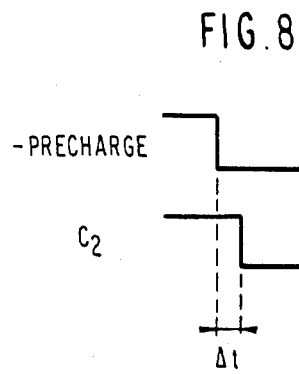
FIG. 8 is a timing diagram for the circuit of FIG. 7.

The -PRECHARGE signal is delayed, as shown in FIG. 8 by two inverters 44 and 46, to form a delayed precharged signal $C_2$, which is applied to the upper and lower precharge gates 18 and 20 in the usual way. The delayed precharge signal $C_2$ is also applied to a third precharge gate 48. The third precharge gate 48 is a p-channel gate and is connected between the power supply and the grounding node $N_G$ of the logic group 14. As a result, following the downward transition of the delayed precharge signal $C_2$, the signal node $N_0$ is isolated from the inverters 22 and 32 and is instead connected to the power supply for precharging. Furthermore, the grounding node $N_G$ is isolated from ground and is connected also to the power supply for precharging. Thus, both nodes $N_0$ and $N_G$ of the logic group 14 are precharged. During this delayed precharging period, the input signals $X_1-X_N$ are held at their values of the prior evaluation phase by memory units of other logic modules corresponding to the inverters 22 and 32. Primary inputs to the CVS circuits must follow the same convention which could be accomplished by attaching a pass gate 42 and inverters 22 and 32 to the primary inputs $PI_i$.

The principle operation is that the combination of input signals $X_1-X_N$ of the prior evaluation phase caused certain of the logic gates 16 to close and thus to discharge the internal capacitances 36-40. The discharging could either have been directly downward to the grounding node $N_G$ or could have first followed an upward path to the signal node $N_0$ before reversing to a fully conductive path to the grounding node $N_G$. In some types of CVS circuits, it may be possible that more complex discharging paths are formed. Thus, whatever discharging paths to the nodes $N_0$ and $N_G$ were formed during the prior evaluation phase are also formed in the current precharging. However, both of the nodes $N_0$ and $N_G$ are held at the precharging voltage during precharging so that whatever internal capacitances 36-40 were discharged during the prior evaluation are precharged. The precharging of all capacitances is to the same supply power voltage.

The relative timing of the -PRECHARGE signal and the delayed PRECHARGE signal $C_2$ is shown in FIG. 8. The important point is that the delay $\Delta t$ is substantially less than the duration of either pulse. A value of 600 ps for $\Delta t$ would be reasonable although its best value depends on the rest of the circuit. When the -PRECHARGE signal transitions high, the pass gate 42, is reclosed. The precharge now existing on the signal node $N_0$ causes the output signal Y to go to 0. As a result, all the input signals $X_1-X_N$ $X_N$ go to 0 because the same convention is applied to these inputs. Thus all the logic gates 16 in the logic group 14 go non-conducting for the final time of the delayed precharge signal $C_2$. This prevents a memorized conducting path from erroneously discharging the precharged signal node $N_0$ if the various transitions are not timed exactly. Finally, the delayed precharge signal $C_2$ transitions high to discontinue the precharging and to reconnect the grounding node $N_G$ to the ground.

Then the application of the current set of the primary inputs $PI_i$ will initiate the domino effect upon fully precharged logic groups 14. The internal capacitances 36-40 have been precharged to the same voltage as the capacitance 34. As a result, there is no redistribution of precharge.

The circuit of FIG. 7 shows that the delayed precharge signal $C_2$ is generated locally, that is, in the neighborhood of the logic group 14, from the precharge signal -PRECHARGE. This approach necessitates two additional gates 44 and 46 for each logic group 14. It is possible that both the precharge signal -PRECHARGE and the delayed precharge signal $C_2$ are generated at one point on an integrated circuit and then both are distributed to all of the logic groups 14 on the integrated circuit. This central generation of both precharging signals of course necessitates additional interconnections. However, the routing for both sets of interconnections can be the same so that the complexity is not greatly increased. Furthermore, if the two interconnections are routed in parallel, any time skew affecting one of the precharging signals affects the other. As a result, the amount of delay $\Delta t$ is easily maintained over the long interconnections.

Figure 9:
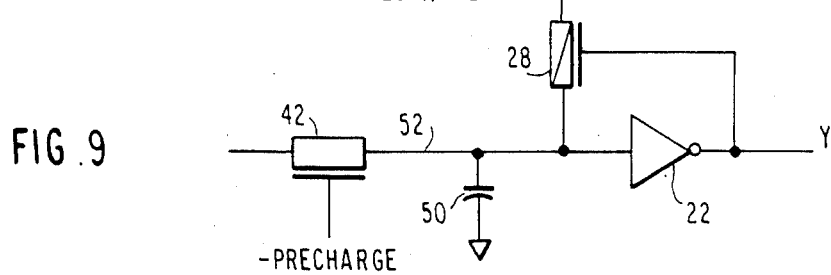
FIGS. 9 and 10 are alternative memory units for the circuit of FIG. 7.

The embodiment shown in FIG. 7 used two anti-parallel inverters 22 and 32 as the memory unit, that is, the memory unit is fully regenerative. However, it should be remembered that there is some parasitic capacitance 50, as shown in FIG. 9, on the interconnection 52 between the pass gate 42 and the inverter 22. Furthermore, the main leakage associated with this interconnection 52 is to ground. That is, the capacitance 50, for the most part, adequately holds a low signal but is somewhat undependable for a high or charged signal. Accordingly, the feedback gate 30 connected between the interconnection 52 and ground can be dispensed with. The required memory function can be adequately fulfilled by the p-channel feedback gate 28, the capacitance 50 and the inverter 22.

Figure 10:
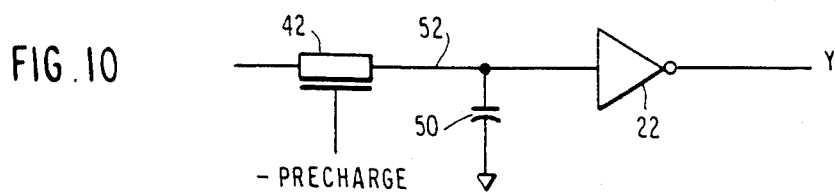

It is also possible, as shown in FIG. 10, to completely dispense with the feedback gate in the memory unit. The capacitor 50 is itself a memory unit. Admittedly, it is somewhat leaky, particularly for high level signals but as long as the capacitance 50 is required to memorize the signal only for a time shorter than its leakage time, it alone is satisfactory. The leakage time can be lengthened by intentionally including a large capacitance 50 that has relatively low leakage compared to that of the interconnection 52. Nonetheless, the capacitor 50 and the interconnection 52 do leak so that the circuit of FIG. 10 is dynamic. As a result, there will be a minimum operating frequency between the precharging periods to ensure that the memory unit of FIG. 10 does not decay to an incorrect value. In the embodiments of FIGS. 9 and 10, it is of course assumed that the rest of the circuit of FIG. 7 is maintained.

Having thus described my invention, what I claim as new, and desire to secure by Letters Patent is:

1. A precharge circuit for a cascode voltage network wherein said network comprises a plurality of gate groups, each gate group comprising a network of one or more logic gates connected between a voltage node and a grounding node and having an output node carrying a signal derived from said voltage node, each said logic gate controlled by a primary input or by a signal on the output node of another gate group, said circuit comprising:

means coupled to said voltage and grounding nodes for precharging said voltage and grounding nodes of each of said gate groups to a first potential level during a precharging period, said precharging period being simultaneous for each of said gate groups, thereby replenishing charge to nodes within each of said gate groups lost during a preceding evaluation phase;

output means coupled to said output node for holding a signal on said output node derived from the signal on said voltage node of each of said gate groups at a time prior to said precharging period, said holding extending from commencement to at least a later portion of said precharging period, and for deriving the signal on said output node from the present signal on said voltage node at a time later than said precharging period.

2. A precharging circuit for a gate group of a cascode voltage network wherein said network comprises one or more gate groups, each gate group comprising a network of one or more logic gates between a voltage node and a grounding node and an output node carrying a signal derived from said voltage node, each said logic gate controlled by a primary input or by a signal on an output node of another gate group, said circuit comprising:

a first switch connected between said grounding node and a first potential;

a second switch connected between said voltage node and a second potential;

a third switch connected between said grounding node and said second potential;

a pass switch having an input connected to said voltage node and an output;

memory means coupled to said pass switch and said output node for outputting to said output node a signal related to the last signal passed by said pass switch to its output when said pass switch was conducting;

first means for changing the state of said pass switch from conducting to non-conducting at a first time; and second means for changing the state of said first switch from conducting to non-conducting and the states of said second and third switches from non-conducting to conducting at a time no earlier than said first time.

3. A precharging circuit as recited in claim 2:

wherein said first switch and said pass switch are MOS transistors of one conductivity type and said second and third switches are MOS transistors of another conductivity type; and wherein said first means comprises first pulse generating means for applying a first voltage pulse to said pass switch; and wherein said second means comprises second pulse generating means for applying a second voltage pulse to said first, second and third switches, said second pulse having the same polarity as said first pulse, beginning no sooner than the beginning and before the end of said first pulse and ending no sooner than the end of said first pulse.

4. A precharging circuit as recited in claim 3, wherein said second pulse generating means comprises delaying means, an input of which is connected to said first pulse generating means.

5. A precharging circuit as recited in claim 2 wherein said memory means comprises a first buffer amplifier having an input connected to the output of said pass switch and a second buffer amplifier being weaker in gain than said first buffer amplifier, and having an output connected to the output of said pass switch and having an input connected to an output of said first buffer amplifier.

6. A precharging circuit as recited in claim 2 wherein said memory means comprises a buffer amplifier having an input connected to the output of said pass switch and a capacitance between said output of said pass switch and a fixed potential level.

7. A precharging circuit as recited in claim 3, wherein said memory means comprises a buffer amplifier having an input connected to the output of said pass switch and a MOS transistor connected between the output of said pass switch and a fixed potential level and the gate of which is connected to an output of said buffer amplifier.

* * * * *